US007728608B2

(12) United States Patent
Hasegawa

(10) Patent No.: US 7,728,608 B2

(45) Date of Patent: Jun. 1, 2010

(54) METHOD FOR ASSEMBLING ELECTRICAL CONNECTING APPARATUS

(75) Inventor: Yoshiei Hasegawa, Kanagawa (JP)

(73) Assignee: Kabushiki Naisha Nihon Micronics, Tokyo (JP)

( * ) Notice: Subject to any disclaimer, the term of this patent is extended or adjusted under 35 U.S.C. 154(b) by 279 days.

(21) Appl. No.: 12/091,207

(22) PCT Filed: Oct. 24, 2005

(86) PCT No.: PCT/JP2005/019850

§ 371 (c)(1), (2), (4) Date: Apr. 23, 2008

(87) PCT Pub. No.: WO2007/046153

PCT Pub. Date: Apr. 26, 2007

(65) Prior Publication Data

US 2009/0284273 A1 Nov. 19, 2009

(30) Foreign Application Priority Data

Oct. 24, 2005 (JP) ................. PCT/JP2005/019850

(51) Int. Cl.
*G01R 31/02* (2006.01)

(52) U.S. Cl. ........................ 324/754; 324/757; 324/758

(58) Field of Classification Search ....................... None
See application file for complete search history.

(56) References Cited

U.S. PATENT DOCUMENTS 6,509,751 B1 * 1/2003 Mathieu et al. ............. 324/754

FOREIGN PATENT DOCUMENTS

| | | | |
|---|---|---|---|
| JP | 07-050324 | | 2/1995 |
| JP | 2001-076787 | | 3/2001 |
| JP | 2003-123921 | | 4/2003 |
| WO | 01/717779 | A2 | 9/2001 |
| WO | 2006/126279 | | 11/2006 |

* cited by examiner

*Primary Examiner*—Minh N Tang
(74) *Attorney, Agent, or Firm*—Stolowitz Ford Cowger LLP

(57) ABSTRACT

A method for assembling an electrical connecting apparatus having a support member, a probe board, and spacers arranged between the support member and the probe board. A height of at least either each abutting part of the support member or each abutting part of the probe board facing the abutting part is measured, and a length of each of the plurality of spacers is measured. Based on measurement values obtained by these measurements, a spacer appropriate for maintaining tips of numerous probes provided on the probe board on the same plane is selected for each pair of the both abutting parts.

6 Claims, 4 Drawing Sheets

METHOD FOR ASSEMBLING ELECTRICAL CONNECTING APPARATUS

RELATED APPLICATIONS

This application is a national phase application and claims priority to pending international application Ser. No. PCT/JP2005/019850, filed Oct. 24, 2005.

TECHNICAL FIELD

The present invention relates to a method for assembling an electrical connecting apparatus such as a probe card to be used for an electrical test of an electrical circuit to electrically connect, for example, an integrated circuit as a device under test to a tester that performs an electrical test of it.

BACKGROUND ART

As one of the conventional electrical connecting apparatuses of this kind is proposed an electrical connecting apparatus comprising a probe board provided with a plurality of probes and enabling adjustment of the planarity of the probe board (refer to Patent Document 1). With this conventional electrical connecting apparatus, a thrusting force or a tensile force can act from a support member supporting the probe board toward a part of the probe board. Adjustment of this acting force can correct bent deformation of the probe board even if the probe board is bent to maintain the planarity of the probe board.

Accordingly, since the planarity of the probe board can be maintained by the aforementioned adjustment work after the probe board has been attached to the support member even if the probe board is bent and deformed at the time of manufacture of the probe board provided with the plurality of probes, the tips of the plurality of probes extending from the probe board can be held on the same plane. Thus, since the tips of all the probes can reliably contact electrical connecting terminals, corresponding to the respective probes, of an electrical circuit as a device under test, efficient electrical contact can be attained between them.

However, in the aforementioned prior art described in Patent Document 1, adjustment is needed every time of attachment of the probe board to the support member in accordance with bent deformation introduced in each probe board so that all the probe tips are located on the same plane. The adjustment work to make all the probe tips appropriately contact the aforementioned corresponding respective electrical connecting terminals of the device under test in a state where the probe board is attached to the support member is troublesome and requires skills. Especially, in a test of numerous integrated circuits formed on a semiconductor wafer, the number of probes of the probe assembly significantly increases, and thus the adjustment work to let such numerous probes appropriately contact the corresponding respective pads on the semiconductor wafer is not easy.

Under such circumstances, the present applicant proposed in a prior International Patent Application (PCT/JP2005/009812) an electrical connecting apparatus that requires no planarity adjustment work of the probe board after being attached to the support member regardless of the deformation of the probe board and enables reliable electrical connection between the probes and the corresponding electrical connecting terminals of the electrical circuit as a device under test.

In this electrical connecting apparatus, the probes are formed on the probe board that is bent and deformed in a free state under no load so that the tips are aligned on the same plane. Between the attachment surface of the support member and the probe board is arranged a spacer allowing an attachment bolt to pass therethrough, and the spacer acts to keep the aforementioned deformation of the probe board at the time of tightening of the attachment bolt. Accordingly, since the probe board is attached to the reference surface of the aforementioned support member in a state of keeping the aforementioned deformation, all the probe tips are located on the same plane.

Thus, after the probe board is attached to the support member, the tips of all the probes can be thrust to the respective electrical connecting terminals of the electrical circuit as a device under test approximately uniformly without the need for the conventional adjustment work for planarization of the probe board. As a result, the aforementioned conventional troublesome planarity adjustment work is not needed per replacement of the probe assembly, which enables an efficient electrical test.

However, the length dimension of the space of this kind includes a process tolerance, which is an allowable error at the time of manufacture of it. Also, the respective abutting parts of the support member and the probe board receiving the edge surfaces of the spacer also include respective process tolerances. Thus, even when the electrical connecting apparatus having the support member, spacer, and probe board manufactured within the respective process tolerances is assembled, variation exceeding a predetermined tolerance may occur in the height positions of the probe tips due to the synergistic effect of the process tolerances of the respective parts.

In order to restrict this variation, there is an idea of decreasing the respective process tolerances of the support member, the spacer whose one edge abuts on the attachment surface of the support member, and the probe board on which the other edge of the spacer abuts. However, heightening their process accuracies to decrease the process tolerances of the respective component parts raises their costs, as a result of which the price of the electrical connecting apparatus gets high.

[Patent Document 1] Japanese Patent Appln. Public Disclosure No. 2003-528459

DISCLOSURE OF THE INVENTION

Problems to be Solved by the Invention

It is an object of the present invention to provide a method for assembling an electrical connecting apparatus that enables to restrict variation of tips of probes provided on a probe board without the need for decrease of process tolerances of respective component parts.

Means to Solve the Problems

An electrical connecting apparatus at which the present invention targets has a support member, a flat-plate-shaped probe board arranged to be spaced from the support member, the probe board having one surface thereof opposing the support member and being provided on the other surface with numerous probes electrically connected to a tester and abutting at their tips on electrical connecting terminals of a device under test that undergoes an electrical test by the tester, and a plurality of spacers arranged between the support member and the probe board, both edges of each of said spacers abutting on both mutually facing abutting parts on mutually opposing surfaces of said support member and said probe board. In assembling the aforementioned electrical connecting apparatus, an assembling method according to the present invention comprises the steps of measuring a height of each abutting part of the support menber and each abutting part of the probe board facing the abutting part, measuring a length of each of the plurality of spacers formed in advance, and selecting the spacer appropriate for rastricting variety the tips of the probes for each pair of the mutually facing both abutting parts of the support member and the probe board at least based on measurement values obtained by both the measurements.

The support member is processed so that its dimension may fall within a process tolerance, but since the actual dimension of each abutting part of this support member is allowed to have variation within the process tolerance, a height level of each abutting part generally has variation within the process tolerance. In the same manner, variation within its process tolerance occurs in a level of each abutting part of the probe board. Also, variation within its process tolerance occurs in a length dimension of each spacer.

In the assembling method according to the present invention, a height of each abutting part of both the support member and the probe board on which both edges of each spacer respectively abut is measured, and a length dimension of each spacer is measured.

Since the actual length of each spacer and the actual height level of each abutting part of the support member or the probe board receiving the edge portion of the spacer can be apparent by these measurements, an optimal spacer can be selected for each pair of both the abutting parts paired between the support member and the probe board so that the combination can let the error of the abutting part and the error of the spacer cancel each other, or so that the combination can reduce influence of these errors.

Since each pair of both the abutting parts and the spacer corresponding to the abutting parts pair can be combined so that the combination may most optimally restrict variation of the tips of the probes by selection of the spacer, variation of the tips of the probes can be restricted without causing changes in the process tolerance of the support member or the probe board and the process tolerance of the spacer.

Moreover, since the aforementioned combination is based on data obtained from the actual measurement values, an optimal combination can be found relatively easily without the need for skills based on a person's sense as in the conventional adjustment, and thus variation of the probe tips can be restricted easily and reliably.

Also, in addition to measuring a height of the abutting part of either the support member or the probe board, by measuring the height of the abutting part of the other one and determining the combination with use of three measurement results, which are respective measurement results of both mutually paired abutting parts and a measurement result of the spacer, respective process tolerances of the support member and the probe board and a process tolerance of the spacer can be considered, and thus variation of the probe tips can be restricted effectively.

As measurement of a height of the abutting part, a difference between a reference height level of the abutting parts and a height level of each abutting part can be measured. In such a case, for measurements of heights of both the abutting parts of the support member and the probe board, individual reference height levels are adopted respectively for the support member and the probe board. Also, as measurement of a length of the spacer, a difference between a reference length of the spacers and a length of each spacer can be measured. In these measurements, a laser measurement apparatus using laser beam, an automatic measurement apparatus utilizing a CCD camera with an autofocus function or the like may be used for example.

In a case where the electrical connecting apparatus is provided with a plurality of screw members passing through the support member and passing through the spacers and where a plurality of anchor portions are provided on the one surface of the probe board and formed as the abutting parts of the probe board, wherein the anchor portions having at their respective top portions screw holes in which tip edge portions of the respective screw members are screwed are opened and whose all top surfaces have undergone a grinding process in advance so as to be on height positions within a process tolerance, as measurement of a height of the abutting part of the probe board in the method according to the present invention, a difference between a reference plane of top surfaces of the anchor portions and the top surface is measured, and the spacer appropriate for restricting variety of the tips of the probes can be selected for each pair of both the abutting parts based on the respective measurement values regarding at least the anchor portion and the spacer.

Since each anchor portion and the spacer corresponding to the top surface of the anchor portion can be combined so that the combination may most optimally restrict variation of the tips of the probes by this selection, variation of the tips of the probes can be restricted without causing changes in the process tolerance of the anchor portion of the probe board and the process tolerance of the spacer.

In a case where the probe board is a flat-plate-shaped probe board bent and deformed in a free state under no load, and the tips of the probes provided on the other surface of the probe board are held on the same plane in a state where the probe board maintains the deformation, the combination of each pair of both the abutting parts at the support member and the probe board and the corresponding spacer can be selected to be a combination optimal to maintain the bent deformation of the probe board. By adopting this selection criterion, even if the probe board is bent and deformed, variation of the probe tips can be restricted without causing changes in the process tolerances of the spacer and the support member.

Also, in a case where the tips of the probes undergo a grinding process so that they may be located on the same plane within a process tolerance in a state where the probe board maintains its deformation, the combination of each abutting part at the support member and the spacer corresponding to the abutting part can be selected to be a combination optimal to restrict variation of the tips of the probes within the tolerance. By adopting this selection criterion, variation of the probe tips within the tolerance can be restricted without causing changes in the process tolerances of the spacer and the support member.

In an electrical connecting apparatus in which, between the support substrate and the probe board is arranged a wiring board having a circuit to be connected to the tester and having a through hole that allows the screw member to pass therethrough, and between the wiring board and the probe board is arranged a connector having a through hole that allows the screw member to pass therethrough and connecting the circuit of the wiring board to each probe of the probe board, with the method according to the present invention, the screw member is arranged to pass through the respective through holes of the wiring board and the connector, and after the spacer is inserted in the respective through holes in relation to the screw member, the probe board can be coupled with the support substrate by tightening the screw member toward the anchor portion.

Effect of the Invention

With the assembling method according to the present invention, since variation of the tips of the probes can be restricted without causing changes in the process tolerance of the support member or the probe board and the process tolerance of the spacer as described above, variation of the tips of the probes can be restricted without raising process accuracies of these parts, that is, without causing increase of manufacturing cost by improvement in the process accuracies.

Also, since the combination of each pair of both the abutting parts and the spacer is based on data obtained from the actual measurement values, an optimal combination can be found relatively easily without the need for skills based on a person's sense as in the conventional adjustment, and thus variation of the probe tips can be restricted easily and reliably.

BEST MODE FOR CARRYING OUT THE INVENTION

Figure 1:
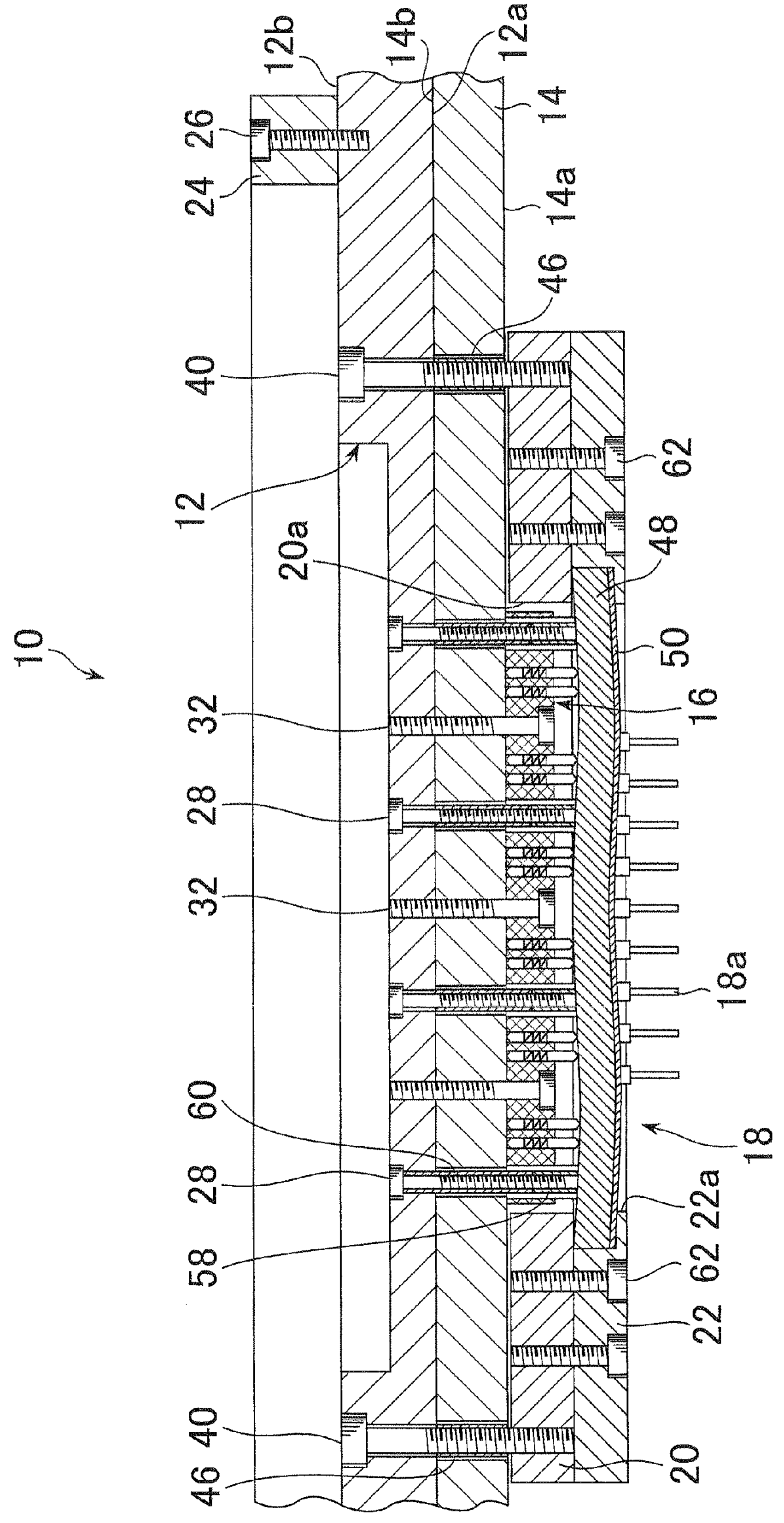
FIG. 1 is a longitudinal sectional view showing an embodiment of an electrical connecting apparatus according to the present invention.

An electrical connecting apparatus 10 according to the present invention comprises a flat-plate-shaped support member 12 in which a lower surface 12*a* is a flat attachment reference surface, a circular flat-plate-shaped wiring board 14 held on the attachment surface 12*a* of the support member, a probe board 18 electrically connected to the wiring board via an electrical connector 16, a base ring 20 having formed therein a center opening 20*a* receiving the electrical connector 16, and a fixing ring 22 sandwiching the rim portion of the probe board 18 in cooperation with the rim portion of the center opening 20*a* of the base ring, as shown in FIG. 1. The fixing ring 22 has at its center portion a central opening 22*a* that allows exposure of probes 18*a* of the probe board 18. In the example shown in the figure, a thermal deformation restricting member 24 for restricting thermal deformation of the support member 12 holding the wiring board 14 is attached to an upper surface 12*b* of the support member 12 by a bolt 26.

The electrical connecting apparatus 10 is used, for example, for an electrical test of numerous IC circuits integrated on a semiconductor wafer, to connect respective connecting pads as connecting terminals of the IC circuits to an electrical circuit of a tester, as is conventionally well known although not shown in the figure.

Figure 2:
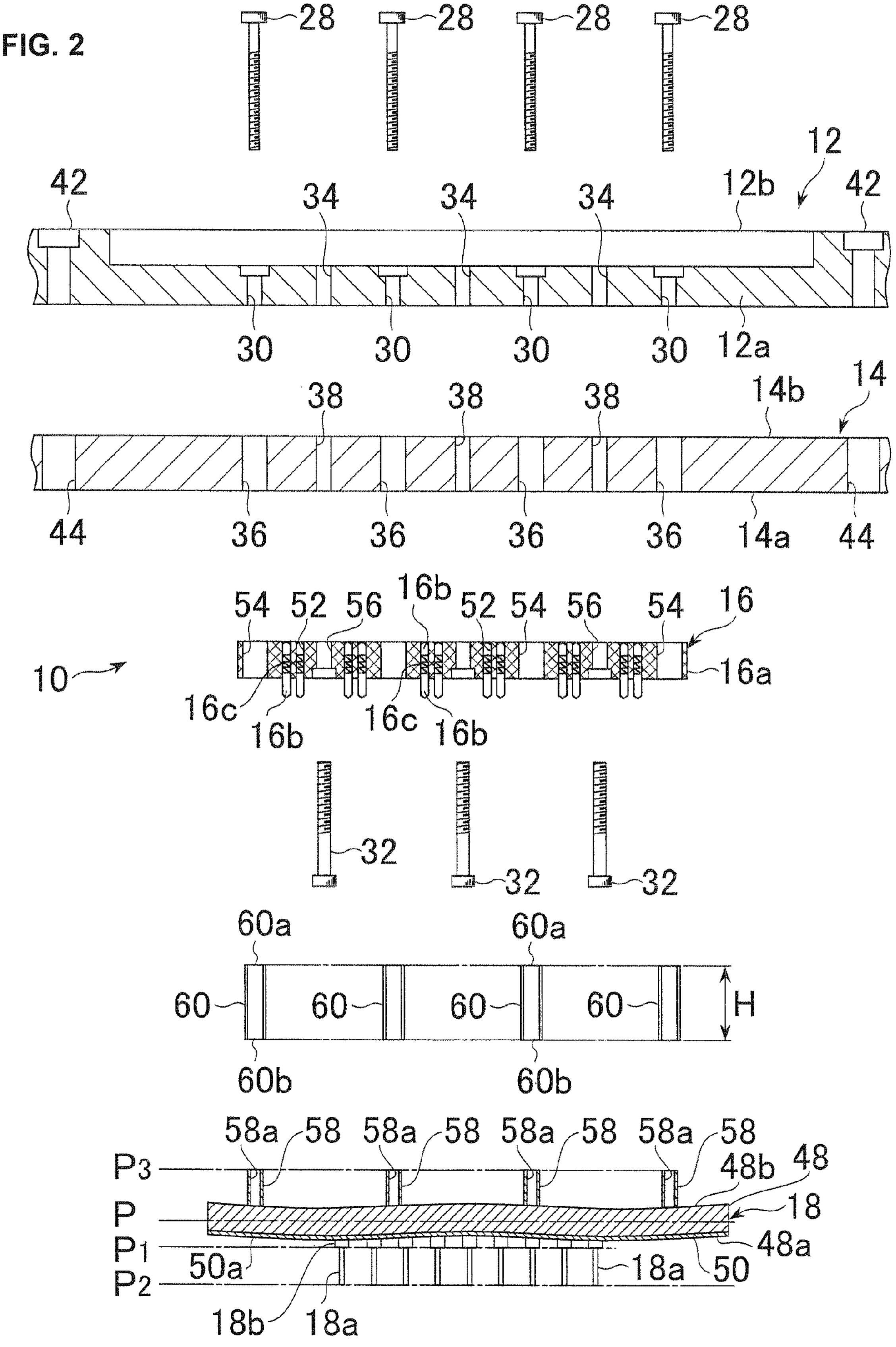
FIG. 2 is an exploded longitudinal sectional view showing main parts of the electrical connecting apparatus shown in FIG. 1.

FIG. 2 is an exploded view showing main parts of the present invention excluding auxiliary parts such as the base ring 20, the fixing ring 22, the thermal deformation restricting member 24, and so on from the electrical connecting apparatus 10 shown in FIG. 1. Referring to FIG. 2, the wiring board 14 comprises an entirely circular plate-shaped polyimide resin plate, for example, and has on its lower surface 14*a* conventionally well-known numerous connecting terminals (not shown) to be connected to the aforementioned electrical circuit of the aforementioned tester arranged in a rectangular matrix form.

The support member 12 comprises a plate-shaped frame member made of, for example, a stainless plate whose attachment surface 12*a* is arranged to abut on an upper surface 14*b* of the wiring board 14. The thermal deformation restricting member 24 shown in FIG. 1 comprises an annular member arranged to cover the rim portion on the upper surface 12*b* of the support member 12 and is constituted by a metal material such as aluminum, for example. This thermal deformation restricting member 24 restricts retroflexion of the support member 12 occurring when significant temperature difference occurs between the attachment surface 12*a* and the upper surface 12*b* of the support member 12 under e.g., a bum-in test of a device under test such as the aforementioned IC circuit.

In the support member 12 are respectively formed through holes 30 that allow attachment bolts 28 for attaching the probe board 18 to the support member 12 to pass therethrough and screw holes 34 in which attachment screws 32 for attaching the electrical connector 16 are screwed. Also, in the wiring board 14 are formed respective through holes 36, 38 corresponding to the through holes 30 and the screw holes 34. These through holes 36, 38 are formed at areas that do not influence electrical connection of the wiring board 14 as in the conventional manner. Also, at the outer rim portions of the support member 12 and the wiring board 14 are formed bolt holes 42, 44 that allow the attachment bolt 40 (refer to FIG. 1) for coupling the base ring 20 with the support member 12 to pass therethrough. In the bolt hole 44 of the wiring board 14 is arranged a conventionally well-known sleeve 46 (refer to FIG. 1) for protecting the wiring board 14 from a tightening force of the attachment bolt 40.

The probe board 18 comprises a substrate member 48 made of e.g., a ceramic plate and a multilayer wiring layer 50 formed on a lower surface 48*a* of the substrate member or ceramic plate, as is conventionally well known, as shown in FIG. 2. The multilayer wiring layer 50 has multilayer plates made of e.g., an electrically insulated polyimide resin material and wiring paths formed between the respective multilayer plates, as is conventionally well known although not shown in the figure. On a lower surface 50*a* of the multilayer wiring layer 50 are formed probe lands 18*b* electrically connected respectively to the aforementioned wiring paths of the multilayer wiring layer. The upper edge of each probe 18*a* is connected to the corresponding probe land 18*b*, and thereby each probe 18*a* is provided on the probe board 18 so as to be protruded downward from the lower surface 50*a* of the multilayer wiring layer 50 and is connected to the aforementioned wiring path of the multilayer wiring layer 50 via each corresponding probe land 18*b*.

In the example shown in FIG. 2, waved bent deformation occurs on the probe board 18 (48, 50) in a free state under no load. Such deformation is sometimes introduced in the ceramic plate 48 at the time of processing of the ceramic plate and sometimes shows height difference between the lowest portion and the highest portion of the lower surface of the probe board 18 to be several tens of micrometers to 100 micrometers, for example. Despite this bent deformation of the probe board 18, the lower edges of the probe lands 18*b* are aligned on a plane PI parallel to a virtual plane P of the probe board 18, and the probes 18a connected to the respective probe lands 18b are formed to have the same length, and thus the lower edges or tips of the respective probes 18a are aligned on a plane P2 parallel to the virtual plane P in a free state of the probe board 18.

On an upper surface 48b of the ceramic plate 48 are formed not shown electrical connecting portions to be connected to the corresponding respective probes 18a via the aforementioned wiring paths of the multilayer wiring layer 50. These electrical connecting portions are formed to correspond to the aforementioned numerous connecting terminals arranged in a rectangular matrix form on the lower surface 14a of the wiring board 14, as is conventionally well known.

Between the aforementioned electrical connecting portions formed on the upper surface 48b of the ceramic plate 48 and the aforementioned connecting terminals of the wiring board 14 corresponding to the respective electrical connecting portions, the aforementioned electrical connector 16 is arranged to connect both the portions corresponding to each other.

In the example shown in the figure, the electrical connector 16 comprises an electrically insulated pogo pin block 16a made of a plate-shaped member in which numerous through holes 52 are formed in the plate thickness direction and pogo pin pairs 16b, 16b each arranged in series within each through hole 52 and each housed slidably in the axis line direction of the through hole 52 in a state of being prevented from dropping from the through hole 52. Between the pogo pins 16b and 16b as each pair is arranged a compression coil spring 16c that gives a biasing force in a direction to be distanced from each other to the both pogo pins 16b, 16b and functions as a conductive path between the both pogo pins. Also, in the pogo pin block 16a are formed through holes 54 aligned with the aforementioned through holes 30, 36 and allowing the attachment bolts 28 to pass therethrough and through holes 56 aligned with the aforementioned screw holes 34 and the through holes 38 and receiving the attachment screws 32.

As for the electrical connector 16, in an assembled state of the electrical connecting apparatus 10 shown in FIG. 1, by the biasing force of the compression coil spring 16c thereof, one pogo pin 16b out of the pogo pins 16b, 16b as each pair is pressure-welded to the aforementioned connecting terminal of the wiring board 14 while the other pogo pin 16c is pressure-welded to the aforementioned electrical connecting portion of the ceramic plate 48 corresponding to the aforementioned connecting terminal of the wiring board 14. Thus, the probe 18a provided in each probe land 18b is reliably connected to the aforementioned corresponding connecting terminal of the wiring board 14. Consequently, when the tip of the probe 18a abuts on the aforementioned connecting pad of the aforementioned IC circuit formed on the semiconductor wafer, the connecting pad is connected to the aforementioned tester via each corresponding probe 18a, the electrical connector 16, and the wiring board 14, and thus an electrical test of the aforementioned IC electrical circuit on the aforementioned semiconductor wafer by the tester is performed.

In the aforementioned assembling of the electrical connecting apparatus 10, to couple the probe board 18 with the support member 12, anchor portions 58 are formed on the upper surface of the probe board 18, that is, the upper surface 48b of the ceramic plate 48. On the top surface of each anchor portion is opened a female screw hole 58a in which the tip edge portion of the attachment bolt 28 passing through the through hole 30 of the support member 12 and the through hole 36 of the wiring board 14 is screwed.

On the probe board 18 shown in FIG. 2, the aforementioned bent deformation occurs, and the top surfaces of the respective anchor portions 58 undergo a grinding process in advance so as to be aligned on a plane P3 parallel to the virtual plane P in a state of maintaining the aforementioned bent deformation of the probe board 18. Also, between the support member 12 to which the probe board 18 is attached and the probe board 18 are applied cylindrical spacers 60 to restrict deformation of the probe board 18 caused by tightening of the attachment bolts 28 and to leave a predetermined space between the top surfaces 58b of the respective anchor portions 58 and the attachment surface 12a of the support member 12.

Figure 3:
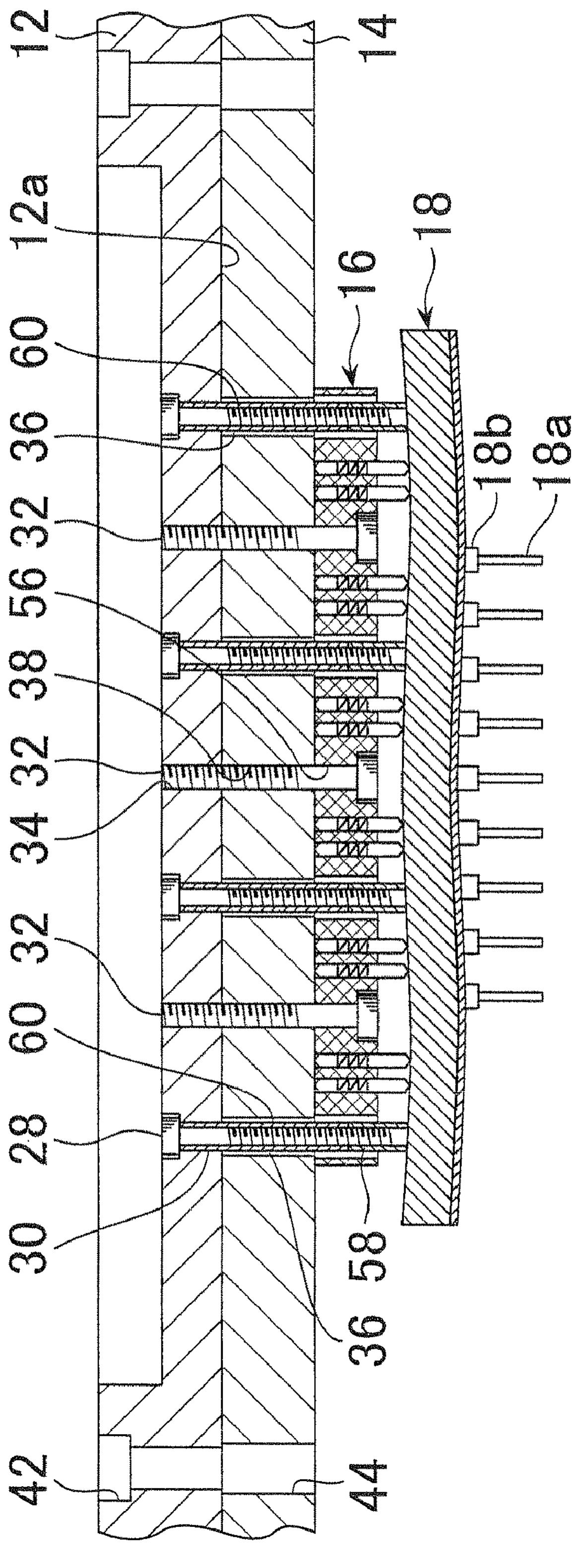
FIG. 3 is a view similar to FIG. 1 into which the main parts of the electrical connecting apparatus shown in FIG. 2 are put together.

Prior to attachment of this probe board 18 to the support member 12, these support member 12, wiring board 14, and electrical connector 16 are integrally combined, as shown in FIG. 3, by the attachment screws 32 each passing through the through hole 56 of the electrical connector 16 and the through hole 38 of the wiring board 14 and each of whose tip edge is screwed in the screw hole 34 of the support member 12. Thereafter, as shown in FIG. 1, the base ring 20 is coupled with the lower surface 14a of the wiring board 14 via the attachment bolts 40 although it is omitted in FIG. 3 for simplification of the drawing. After coupling of this base ring 20, each attachment bolt 28 passes through and is inserted into the through hole 30 of the support member 12 and the through hole 36 of the wiring board 14 from the support member side and is also equipped with the spacer 60 as shown in FIG. 3. Each spacer 60 abuts on the opening rim portion of each through hole 30 on the attachment surface 12a of the support member 12 at its upper edge 60a (refer to FIG. 2).

After equipment of each spacer 60, the tip edge of each attachment bolt 28 is screwed into the female screw hole 58a of the corresponding anchor portion 58 of the probe board 18 and is tightened with a predetermined tightening force. By this tightening, a lower edge 60b (refer to FIG. 2) of each spacer 60 abuts on the top surface 58b of the corresponding anchor portion 58. Thus, as described above, each spacer 60 determines a distance between the top surface 58b of the anchor portion 58 as an abutting part of the probe board 18 on which its lower edge 60b abuts and the opening rim portion 12a' (refer to FIG. 4) of the through hole 30 on the attachment surface 12a as an abutting part of the support member 12 on which its upper edge 60a abuts.

After attachment of the probe board 18 by tightening of the attachment bolts 28, the fixing ring 22 is coupled with the base ring 20 with bolts 62 as shown in FIG. 1, and thereby the rim portion of the probe board 18 is sandwiched between the fixing ring 22 and the base ring 20 as described above, thus to assemble the electrical connecting apparatus 10.

In the electrical connecting apparatus 10 according to the present invention, the upper edge 60a and the lower edge 60b of the spacer 60 are arranged to respectively abut on the support member 12 and the probe board 18 as described above. Also, the spacer 60, and the support member 12 and the probe board 18 having formed thereon the respective abutting parts receiving the upper edge 60a and the lower edge 60b are formed within their own process tolerances.

Figure 4:
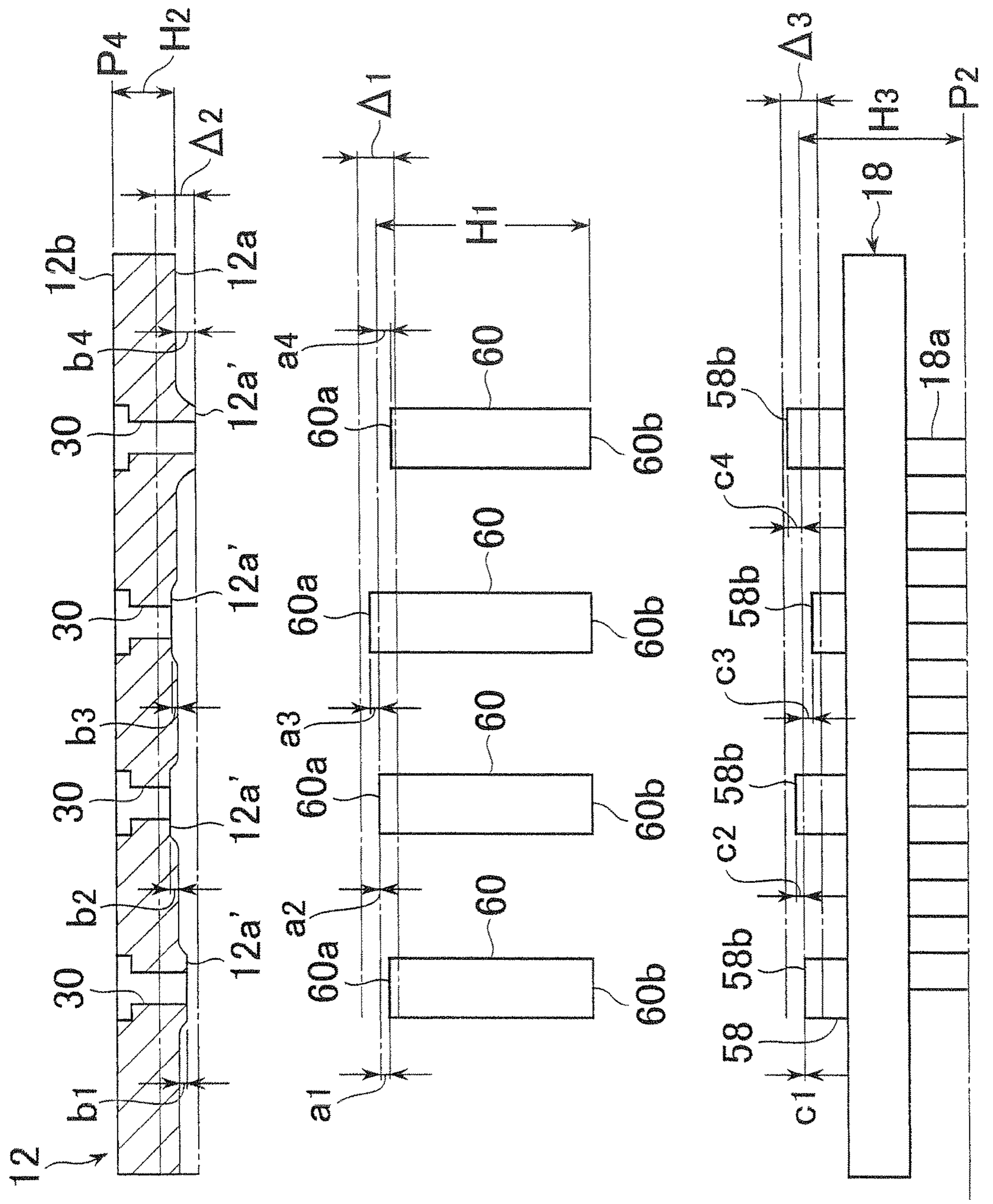
FIG. 4 is a schematic view showing process tolerances of a support member, a spacer and a probe board of the electrical connecting apparatus according to the present invention.

Thus, as shown in FIG. 4, when a design height dimension HI from the lower edge 60b to the upper edge 60a of each spacer 60 is set to be a reference length, in the actual length of each spacer 60, a tolerance a (errors a1 to a4) of the reference height H1±Δ1 where Δ1 is a process error caused. Also, similarly, as for the support member 12, when a design distance to the abutting part at the rim portion of the through hole 30 of the attachment surface 12a as each abutting part, that is, a design distance at the abutting part is set to be a reference height level H2 with the upper surface 12b set as a reference plane P4, in the height level at each abutting part 12a' of the attachment surface 12*a*, a tolerance b (errors b1 to b4) of the reference height level H2±Δ2 where Δ2 is a process error occurs. Further, as for the probe board 18, when the plane P2, parallel to the virtual plane P of the probe board, on which the lower edges of the respective probes 18*a* are aligned is set as a reference plane, and a design distance from the reference plane P2 to the top surface 58*b* of the anchor portion 58 is set to be a reference height level H3 at the top surface 58*b* as the abutting part of the probe board 18, in the height level at the top surface 58*b* of each anchor portion 58, a tolerance c (errors c1 to c4) of the reference height level H3±Δ3 where Δ3 is a process error occurs. It is noted that the aforementioned deformation of the ceramic plate 48 is omitted, and the probe board 18 (48, 50) is shown to be flat in FIG. 4 for simplification of the drawing.

Although each of these tolerances is, e.g., ±10 micrometers, variation reaching +30 micrometers to −30 micrometers at the maximum may occur between the attachment surface 12*a* of the support member 12 and the top surface 58*b* of the probe board 18 despite the use of the spacer 60 depending on the combination of the tolerances Δ1 to Δ3 of the mutually corresponding abutting parts 12*a*', 58*b* and the spacer 60 arranged between the abutting parts, and thus variation at the tips of the respective probes 18*a* in the assembled electrical connecting apparatus 10 may exceed, e.g., +10 micrometers, which is an allowable error of the variation.

Under such circumstances, the actual length of the spacer 60, the actual height at each abutting part 12*a'* of the support member 12, and the actual height at the top surface 58*b* as each abutting part of the probe board 18 are to be respectively measured. For these measurements, the aforementioned respective errors a1 to a4 of the spacer 60, the respective errors b1 to b4 at the respective abutting parts 12*a'* of the support member 12, and the respective errors c1 to c4 at the respective abutting parts of the probe board 18, which are the top surfaces 58*b* of the anchor portion 58, can be measured.

For the actual measurements of these errors, a laser measurement apparatus using laser beam, an automatic measurement apparatus utilizing a CCD camera with an autofocus function, or the like may be used for example.

When the respective errors a1 to a4 of the spacer 60, the respective errors b1 to b4 at the respective abutting parts 12*a'* of the support member 12, and the respective errors c1 to c4 at the respective abutting parts of the probe board 18, which are the top surfaces 58*b* of the anchor portion 58, are obtained by these actual measurements, each added value (b+c, that is, b1+c1, b2+c2, b3+c3, b4+c4) of the respective errors at each abutting part 12*a'* of the support member 12 and each abutting part 58*b* of the probe board 18 corresponding to each other is derived. Subsequently, a spacer 60 to be arranged to each pair of the abutting parts 12*a'* and 58*b* opposed to each other is selected so that, when each added value (c+b) of these errors and the error (a) of each spacer 60 are added (a+b+c), the variation among such combinations is least significant.

In this manner, by inserting the spacer 60 between each pair of the abutting parts 12*a'* and 58*b* corresponding to each other so that the variation among the added value additions (a+b+c) of the respective errors may become least significant, the aforementioned variation of the tips of the respective probes 18*a* is restricted and can be maintained within the allowable error.

With the method for assembling the electrical connecting apparatus 10 according to the present invention, in a case where the probe board 18 is a flat-plate-shaped probe board bent and deformed in a free state under no load, and the tips of the probes 18*a* provided on the probe board are held on the same plane P2 in a state of maintaining the aforementioned deformation of the probe board as described along FIG. 2, the combination of the pair of the abutting parts 12*a*' and 58*b* at the support member 12 and the probe board 18 and the corresponding spacer 60 can be selected to be a combination optimal to maintain the bent deformation of the probe board 18.

By adopting this selection criterion, even if the probe board 18 is bent and deformed, variation of the probe tips can be restricted without causing changes in the process tolerances Δ1 to Δ3 of the spacer 60, the support member 12, and the probe board 18. Also, since this selection can be done based on the respective actual measurement values, it can be done relatively easily without relying on instinct.

Also, in a case where the tips of the probes 18*a* undergo a grinding process so that they may be located on the same plane P2 in a state where the probe board 18 maintains its deformation, the combination of the pair, consisting of the abutting part 12*a'* at the support member 12 and the abutting part 58*b* at the probe board 18 corresponding to the abutting part, and the spacer 60 to be arranged therebetween can be selected to be a combination optimal to restrict variation of the aforementioned tips of the aforementioned probes within the tolerance. By adopting this selection criterion, variation of the probe tips within the tolerance can be restricted without causing changes in the process tolerances of the spacer and the support member, and the probe tips can be aligned on the same plane highly accurately.

Although an example of selecting each spacer 60 from as many spacers 60 as the number of pairs each consisting of the mutually corresponding abutting parts 12*a*' and 58*b* for each optimal combination has been explained in the foregoing description, this is not necessarily the case, but a combination in which the added value addition (a+b+c) of the respective errors is zero can be found by selecting a spacer 60 from more spacers 60 than the number of pairs each consisting of the mutually corresponding abutting parts 12*a'* and 58*b*. By doing so, variation of the tips of the respective probes 18*a* can be virtually eliminated.

Further, an example of measuring the heights of both the abutting parts 12*a*' of the support member 12 and the abutting parts 58*b* of the probe board 18 has been explained in the foregoing description, but instead, each spacer 60 may be selected based on the errors (either a1 to a4 or c1 to c4) derived by measurements of the heights of either the abutting parts 12*a'* or the abutting parts 58*b* and the errors (b1 to b4) derived by measurements of the lengths of the spacers 60.

However, it is preferable for the purpose of restricting variation of the tips of the respective probes 18*a* more accurately and reliably that, as described above, the respective heights of the abutting parts 12*a'* of the support member 12 and the abutting parts 58*b* of the probe board 18 are measured, and their errors (a1 to a4 and c1 to c4) and the errors (b1 to b4) of the spacers 60 are considered, to select the spacers 60 for the respective pairs each consisting of the mutually corresponding abutting parts 12*a'* and 58*b*.

Also, in addition to measuring the heights of the aforementioned both abutting parts 12*a'*, 58*b* and the lengths of the corresponding spacers 60, by measuring the lengths of the corresponding probes 18*a*, displacement of the lower edge positions of the corresponding respective probes 18*a* is also considered to select each combination of the both abutting parts 12*a'*, 58*b* and the spacer 60 arranged therebetween. By doing so, variation of the tips caused by a process tolerance of the respective probes 18*a* can be restricted effectively as well.

The aforementioned method according to the present invention may be applied to an electrical connecting apparatus having a flat probe board in which no bent deformation is introduced.

The present invention is not limited to the above embodiments, but can be altered without departing from the spirit of the present invention.

The invention claimed is:

1. A method for assembling an electrical connecting apparatus having a support member, a flat-plate-shaped probe board arranged to be spaced from said support member, said probe board having one surface thereof opposing said support member and being provided on the other surface with numerous probes electrically connected to a tester and abutting at their tips on electrical connecting terminals of a device under test that undergoes an electrical test by said tester, and a plurality of spacers arranged between said support member and said probe board, both edges of said each spacer abutting on both mutually facing abutting parts on mutually opposing surfaces of said support member and said probe board, said method comprising the steps of:

measuring a height of each said abutting part of said support member and each said abutting part of said probe board;

measuring a length of each of said plurality of spacers formed in advance; and selecting said spacer appropriate for restricting variety of said tips of said probes for each pair of both said abutting parts based on measurement values obtained by said both measurements.

2. The assembling method according to claim 1, wherein measurement of a height of said abutting part is measurement of a difference between a reference height level of said abutting parts and a height level of each said abutting part, and measurement of a length of said spacer is measurement of a difference between a reference length of said spacers and a length of each said spacer.

3. The assembling method according to claim 1, wherein said electrical connecting apparatus provided with a plurality of screw members passing through said support member and passing through said spacers, and having formed as said abutting parts of said probe board on said one surface of said probe board a plurality of anchor portions at whose respective top portions screw holes in which tip edge portions of said respective screw members are screwed are opened and whose all top surfaces have undergone a grinding process in advance so as to be on height positions within a process tolerance, wherein, as measurement of a height of said abutting part of said probe board, a difference between a reference height level of top surfaces of said anchor portions and a height level of said top surface is measured, and said spacer appropriate for restricting variety of said tips of said probes is selected for each pair of said both abutting parts based on said respective measurement values regarding at least said anchor portion and said spacer.

4. The assembling method according to claim 1, wherein said probe board is a flat-plate-shaped probe board bent and deformed in a free state under no load, said tips of said probes are held on the same plane in a state where said probe board maintains said deformation, and for the purpose of maintaining the bent deformation of said probe board, said spacer is selected for each pair of said both abutting parts based on said measurement values.

5. The assembling method according to claim 1, wherein said probe board is a flat-plate-shaped probe board bent and deformed in a free state under no load, said probes undergo a grinding process so that said tips may be located on the same plane within a process tolerance in a state where said probe board maintains said deformation, and said spacer appropriate for restricting variation of said tips of said probes within a process tolerance is selected for each pair of said both abutting parts based on said measurement values.

6. The assembling method according to claim 3, wherein between said support member and said probe board is arranged a wiring board having a circuit to be connected to said tester and having a through hole that allows said screw member to pass therethrough, between said wiring board and said probe board is arranged a connector having a through hole that allows said screw member to pass therethrough and connecting said circuit of said wiring board to said each probe of said probe board, said screw member is arranged to pass through said respective through holes of said wiring board and said connector, and after said spacer is inserted in said respective through holes in relation to said screw member, said probe board is coupled with said support member by tightening of said screw member toward said anchor portion.

* * * * *